United States Patent [19]
Lee et al.

[11] Patent Number: 5,665,659
[45] Date of Patent: Sep. 9, 1997

[54] METHOD FOR FORMING METAL LAYER OF A SEMICONDUCTOR DEVICE

[75] Inventors: Sang-in Lee; Gil-heyun Choi; Young-soo Jeon, all of Kyungki-do, Rep. of Korea

[73] Assignee: Samsung Electronics Co., Ltd., Suwon, Rep. of Korea

[21] Appl. No.: 257,420

[22] Filed: Jun. 9, 1994

[30] Foreign Application Priority Data

Jun. 10, 1993 [KR] Rep. of Korea ............... 1993/10567

[51] Int. Cl.⁶ .................. C23C 14/34; H01L 21/324; H01L 21/44
[52] U.S. Cl. ............. 438/646; 204/192.1; 204/192.17; 204/192.22; 204/192.25; 204/192.3; 438/643; 438/661
[58] Field of Search .................. 437/190, 192, 437/194, 197, 247, 248, 203; 204/192.1, 192.17, 192.22, 192.25, 192.3

[56] References Cited

U.S. PATENT DOCUMENTS

| | | | |
|---|---|---|---|
| 4,758,533 | 7/1988 | Magee et al. | 437/173 |
| 5,171,412 | 12/1992 | Talieh et al. | 204/192.17 |
| 5,175,126 | 12/1992 | Ho et al. | 437/192 |
| 5,242,860 | 9/1993 | Nulman et al. | 437/247 |
| 5,266,521 | 11/1993 | Lee et al. | 437/190 |

*Primary Examiner*—R. Bruce Breneman
*Assistant Examiner*—Rodney G. McDonald
*Attorney, Agent, or Firm*—Cushman Darby & Cushman, IP Group of Pillsbury Madison & Sutro LLP

[57] ABSTRACT

A method for forming a metal layer including the steps of heat treating a semiconductor substrate for a predetermined time at an intermediate temperature between 200° C. and 400° C., then depositing the metal layer on the semiconductor substrate at a temperature below 200° C., in a vacuum, then thermally treating the metal layer at a temperature between $0.6\,T_m$–$1.0\,T_m$ (where $T_m$ is the melting point of the metal layer), without breaking the vacuum, thereby reflowing the grains of the metal layer, and then gradually cooling the metal layer. Alternatively, the intermediate heat-treatment step can be performed after the metal layer is thermally treated, in which case, the metal layer should thereafter be rapidly cooled.

47 Claims, 4 Drawing Sheets

METHOD FOR FORMING METAL LAYER OF A SEMICONDUCTOR DEVICE

BACKGROUND OF THE INVENTION

The present invention relates generally to a method for forming a metal layer of a semiconductor device, and more particularly, to a method for forming a metal layer of a semiconductor device, which protects the surface of the metal layer from deterioration.

The metallization process is generally regarded as one of the most important aspects of semiconductor device manufacturing technology, since it significantly affects the yield, performance (e.g., speed of operation), and reliability of the devices, particularly as the technology advances toward ultra large-scale integration (ULSI). Metal step coverage was not a serious problem in lesser density prior art semiconductor devices, because of the inherent features of such devices having larger geometries, e.g., contact holes having low aspect ratios (the ratio of depth to width) and shallow steps. However, with the increased integration density of semiconductor devices, contact holes have become significantly smaller, while impurity-doped regions formed in the surface of the semiconductor substrate have become much shallower. Due to the resulting higher aspect ratio of the contact holes and the larger steps, with these current, higher-density semiconductor devices, it has become necessary to improve the conventional aluminum (Al) metallization process in order to achieve the standard design objectives of high-speed performance, high yield, and good reliability of the semiconductor device. More particularly, the utilization of the conventional aluminum metallization process in the fabrication of the higher-density semiconductor devices has resulted in such problems as degraded reliability and failure of the aluminum interconnections due to the high aspect ratio of the contact holes and the resulting poor step coverage of the sputtered aluminum, an increase in contact resistance caused by silicon (Si) precipitation, and degradation of the shallow junction characteristics due to aluminum spiking.

In an effort to overcome these problems of the conventional aluminum metallization process, various new processes have been proposed. For example, for preventing degraded semiconductor reliability caused by the above-mentioned failure of aluminum interconnections, various metallization processes have been proposed, such as those disclosed in Japanese Laid-open Publication No. 62-132348 (by Sugano, et al.,), Japanese Laid-open Publication No. 63-99546 (by Shinpei Ijima), Japanese Laid-open Publication No. 62-109341 (by Masahiro Shimizu, et al.), Japanese Laid-open Publication No. 62-211915 (by Hidekazu Okabayashi, et al.), Japanese Laid-open Publication No. 1-246831 (by Seichi Iwamatsu), Japanese Laid-open Publication No. 59-171374 (by Masaki Satou) and European Patent Application No. 87306084.3 (by Ryoichi Mukai, et al.).

According to the above methods, the contact hole is filled by means of melting and reflowing aluminum or an aluminum alloy. More particularly, in the reflowing step, the aluminum or aluminum-alloy layer is heated beyond its melting temperature, and the thus-melted metal is flowed into the contact hole to fill the same. This reflowing step entails the following drawbacks and disadvantages. First of all, since the semiconductor wafer must be disposed horizontally so as to allow proper filling of the contact hole with the flowing melted material, the throughput of the semiconductor device manufacturing process is lowered. Secondly, the liquid metal layer flowed into the contact hole will seek a lower surface tension, and thus, may, upon solidifying, shrink or warp, and thereby expose the underlying semiconductor material. Further, the heat treatment temperature cannot be precisely controlled, and therefore, desired results are difficult to reproduce. Moreover, although these methods may fill a contact hole with the melted material of the metal layer, the remaining areas of the metal layer (outside the contact hole area) may become rough, thereby impairing subsequent photolithographic process steps. Therefore, a second metallization process may be required to smoothen (or planarize) these rough areas of the metal layer.

As an alternative to melting aluminum or aluminum alloy for filing contact holes, and in order to improve the metal step coverage, a multiple step metallization process is disclosed in U.S. Pat. No. 4,970,176 (by Clarence J. Tracey, et al.). In this process, a predetermined first thickness of a metal layer is deposited on a semiconductor wafer at a cold temperature. Then, the temperature is increased to approximately 400° C. to 500° C., which allows the metal layer to reflow while depositing the remaining and relatively thin second thickness of the metal layer. The reflow of the metal layer takes place through grain growth, recrystallization and bulk diffusion.

According to the Tracy method, the step coverage of a contact hole (via hole) having a high aspect ratio can be improved. However, the aluminum or aluminum alloy cannot completely fill a contact hole having an aspect ratio greater than one and a diameter less than 1 μm, since the aluminum or aluminum alloy is deposited at a high temperature.

In the meantime, Ono et al. have disclosed that when the semiconductor substrate temperature is above 500° C., the Al—Si liquidity suddenly increases (see *Proceedings of 1990 VMIC Conference*, Jun. 11 and 12, pp76–82). According to this paper, the stress of an Al-1% Si film changes abruptly near 500° C., and the stress relaxation of such a film occurs rapidly at that temperature. Additionally, the temperature of the semiconductor substrate must be maintained between 500° C. and 550° C. in order to fill the contact holes satisfactorily.

Additionally, Yoda Dakashi et al. have suggested a method for manufacturing a semiconductor device which comprises the steps of forming double barrier layers for preventing a reaction between the wiring layer and the semiconductor substrate or an insulating layer, on the inner surface of the contact holes, and then filling the contact holes with a deposited metal such as an Al—Si alloy while heating the semiconductor substrate to a desired temperature of 500° C. to 550° C., as in the Ono et al. paper (refer to Korean Laid-open Patent Publication No. 90-15277 and European Patent Application No. 90104184.0 corresponding to Japanese Patent Application No. 01-061557 filed on Mar. 14, 1989).

According to the Dakashi and Ono methods, an Al—Si film is deposited at a temperature of 500° C. to 550° C. The Al—Si film thus obtained has crystalline particles grown to about ten microns in diameter, which is rather large. Therefore, there is a high probability that the Al—Si film has strong resistance against electron migration, but weak resistance against stress migration. In addition, highly resistant silicon is crystallized at the interfaces between crystalline particles of the Al—Si film. Thus, it is necessary to remove the Al—Si film at the areas other than the contact hole area, and the metallization process becomes unduly complicated.

Additionally, since the Al—Si film is deposited at a high temperature, voids are formed in the metal layer, thereby resulting in discontinuities of the metal layer.

Additionally, C. S. Park et al. (which includes one of the present inventors) have disclosed a method for forming a metal wiring layer through a contact hole having a high aspect ratio which comprises the steps of depositing an aluminum alloy to a thickness of 3,000 Å at a temperature below 150° C. and post-heating the deposited aluminum alloy at a temperature of 550° C. for 180 seconds, to thereby completely fill the contact hole with the aluminum alloy (see *Proceedings of* 1991 *VMIC Conference*, Jun. 11 and 12, pp 326–328). This method is disclosed in U.S. patent application Serial No. 07/585,218 entitled "A Method For Forming A Metal Layer In A Semiconductor Device," which has been abandoned, and in continuation-in-part application therefor (Ser. No. 07/897,294), now allowed.

FIGS. 1, 2 and 3 illustrate successive steps of a method for forming a metal layer according to the above invention.

FIG. 1 illustrates the formation of a first metal layer. First, a contact hole 22, approximately 0.8 μm in diameter and having a stepped perimeter, is formed in an insulating layer 25 formed on a semiconductor substrate 21. Then, the substrate 21 is put into a sputtering reaction chamber (not shown), and a first metal layer 27 having a thickness of 500–3,000 Å is formed by depositing a metal such as aluminum (Al) or an aluminum alloy, at a temperature of 150° C. or less and under a predetermined degree of vacuum. The first metal layer 27 is comprised of small aluminum grains having a high surface free energy.

FIG. 2 illustrates the filling of the contact hole 22. More particularly, the semiconductor substrate 21 is moved to another reaction chamber (not shown), without breaking the vacuum, and the first metal layer 27 is heat-treated for at least two minutes at a temperature of 550° C., thereby filling the contact hole 22 with the metal. At this time, the pressure in the reaction chamber is preferably as low as possible so that a higher surface free energy is imparted to the aluminum atoms, which can thus more easily migrate into the contact holes. The reference numeral 27a designates a metal layer filling the contact hole.

The heat treatment temperature range in the step depicted in FIG. 2 is between 80% of the melting point (Tm) of the metal and its melting point, and will vary according to the particular aluminum or aluminum alloy employed.

Since the metal layer is heat-treated at a temperature lower than the melting point of aluminum, the metal layer does not melt. For example, the aluminum atoms deposited by sputtering at a temperature below 150° C. migrate upon being heat-treated at 550° C., rather than melting. This migration increases when the surface area is uneven and grainy due to an increase in energy among the surface atoms which are not in full contact with surrounding atoms. Thus, the initially sputtered, grainy layer exhibits an increase in atom migration upon heat-treatment.

FIG. 3 illustrates a step for forming a second metal layer 29. More particularly, the second metal layer 29 is formed by depositing the remainder of the required total metal layer thickness at a temperature selected on the basis of the desired reliability of the semiconductor device, for example, at a temperature below 350° C. This completes the formation of the total (composite) metal layer.

According to the above method, the contact hole can be easily and fully filled with metal, by using the same sputtering equipment used for the conventional deposition method and then annealing the deposited metal. Therefore, even a contact hole with a high aspect ratio can be fully filled by forming and heat-treating a very thin metal layer e.g., about 500 Å. For example, a contact hole with a high aspect ratio (greater than 1.0) and a diameter less than 1 μm can be completely filled. Also, an etching step, as in the above-mentioned Dakashi method, is unnecessary.

However, when a void is formed in the contact hole or when the step coverage of the metal layer is inadequate, the contact hole cannot be filled up while maintaining the semiconductor wafer and deposited metal layer at a desired temperature and vacuum level. Further, although a secondary metal layer is subsequently formed on the semiconductor wafer having a previously deposited primary metal layer, good step coverage of the contact hole cannot be assured, and the reliability of the manufactured semiconductor device is accordingly degraded. According to the above-mentioned method in which metal is deposited at a lower temperature and the metal is heat-treated at a high temperature (below melting point) so that metal grains are reflowed, the grain boundary is severely dug out, thereby creating grooves between the grains of the metal layer. This phenomenon is called grooving. Generally, after the metal layer is formed at a low temperature and the underlying semiconductor substrate cools, succeeding steps of the overall process for manufacturing the semiconductor device are performed. In one of these succeeding steps, an anti-reflective layer is formed on the metal layer. Due to the grooving, slit-shaped cracks or fissures are formed in the anti-reflective layer.

The grooving phenomenon is due to interfacial tension, which increases if cooling is performed too rapidly, i.e., if the temperature is rapidly reduced from a relatively high to a relatively low temperature.

FIGS. 4A and 4B are schematic views of aluminum grains which illustrate the grooving phenomenon. In the drawings, reference numeral 50 is a semiconductor substrate, reference numeral 52 represents a metal layer made of aluminum or an aluminum alloy, reference numeral 54 represents a groove and reference characters Ga, Gb (or Gb') and Gc are metal grains of the metal layer 52.

When the metal layer 52 of aluminum or aluminum alloy is heat-treated repeatedly at high and low temperatures, grain rotation occurs due to strain relaxation, thereby resulting in dislocation slip within and among the metal grains. Specifically, referring to FIGS. 4A and 4B, the metal layer made of aluminum or an aluminum alloy, has a very strong fiber structure having <111> orientation. However, the (111) plane of certain grains (e.g., grain Gb of FIG. 4A) is slightly inclined and not absolutely parallel with the surface of the aluminum or aluminum alloy layer. As shown in FIG. 4A, grain Gb is inclined by an angle ω. When the metal layer 52 of FIG. 4A is heat-treated, grain Gb rotates to have <111> orientation, parallel with the surface of the layer. FIG. 4B shows a grain array after the heat treatment of metal layer 52 of FIG. 4A. Grain Gb' is the grain Gb of FIG. 4A after being rotated to a <111> orientation. Such rotation of the metal grains deepens the unevenness of the metal layer surface and the grooving phenomenon. During cooling, plastic deformation due to tensile strain intensifies the grooving phenomenon.

If such a groove is created when the metal layer of aluminum or aluminum alloy is patterned, chemicals penetrate the layer's surface via the groove, and even when the metal layer is capped, e.g., with titanium nitride (TiN), the capping material is not sufficiently deposited in the grooves, which in effect, negates the capping effect.

FIG. 5 is a cutaway perspective view which illustrates the grooving phenomenon. In FIG. 5, reference numeral 42 represents a diffusion blocking layer of a composite layer consisting of a first diffusion layer of titanium (Ti) and a second diffusion layer of TiN. Reference numeral 44 represents a metal layer of an aluminum alloy. Reference numeral 46 is an anti-reflective layer of TiN. Reference characters G1, G2 and G3 represent grains of the metal layer 44. Reference numeral 48 indicates a groove formed between the grains G1, G2 ad G3. Reference numeral 50 represents a slit-shaped crack formed in the anti-reflective layer 46.

FIG. 6 shows an SEM photograph of the surface of a metal layer made of an aluminum alloy, illustrating the case where, when the metal layer is formed according to the method shown in FIGS. 1, 2 and 3, the grooving phenomenon occurs and the surface of the metal becomes coarse. As can be seen, certain portions of the metal layer exhibit severe grooving. In such portions, the TiN step coverage is so poor that, as shown in FIG. 5, the TiN layer 46 splits. For this reason, when a photoresist layer is developed in a succeeding photolithographic process step, chemicals of the developing solution penetrate the surface so that corrosive pitting occurs, or the chemicals permeate the grains such that a residue remains after etching and creates the potential for electrical shorts.

The present inventors discovered that the grooving phenomenon can be prevented by controlling the rate of cooling of the metal layer and/or by controlling the condition of the surface of an underlayer prior to the deposition of the metal layer, thereby enabling deposition of an aluminum or aluminum alloy whose grains form <111> orientation. The present invention is based on these discoveries.

SUMMARY OF THE INVENTION

Therefore, it is an object of the present invention to provide a method for forming a metal layer for a semiconductor device, wherein, when the metal layer deposited at a low temperature is heat-treated at a high temperature (below its melting point) to reflow the metal layer, the grooving phenomenon of the metal layer is prevented, thereby enhancing the reliability of the metal wiring of the device.

To accomplish the object of the present invention, there is provided a method for forming a metal layer for a semiconductor device which includes the steps of depositing the metal layer on a semiconductor substrate at a low temperature in a vacuum and then thermally treating the metal layer at a high temperature below its melting point, without breaking the vacuum, thereby reflowing the grains of the metal layer, the method further comprising an intermediate heat-treatment step of maintaining the semiconductor substrate at an intermediate temperature between the low and high temperatures for a predetermined time, thereby preventing the creation of grooves between the grains of the metal layer. It is preferable that the low temperature be below 200° C. and that the high temperature be 0.6 Tm–1.0 Tm (where Tm is the melting point of the metal of the metal layer). If precisely measured, the actual temperature of an aluminum surface at the temperature of the heat treating apparatus is observed to be somewhat lower than the temperature of the apparatus. It is believed that the heat treatment of the metal layer of aluminum or an aluminum alloy creates reflow if the actual temperature of the aluminum surface is above 0.6 Tm. It is also preferable that the intermediate temperature be 200° C. to 400° C., and that the intermediate heat treatment step be preformed for more than thirty seconds.

In a first embodiment of the present invention, the intermediate heat-treatment step is performed before the metal layer is formed, whereby impurities such as water vapor, argon and nitride, which are mixed between the grains of an underlayer (usually a diffusion blocking layer), are removed, to thereby enhance the <111> orientation of the grains of the deposited aluminum or aluminum alloy. This action suppresses the grooving phenomenon. In this case, it is desirable that the metal layer be gradually cooled while the semiconductor substrate is placed in vacuum, after the metal layer is reflowed and before succeeding manufacturing process steps for making the semiconductor device are performed.

In an alternative embodiment, the intermediate heat treatment step is performed after the metal layer is reflowed. This suppresses the tensile strain of aluminum grains and therefore prevents the grooving from occurring. It is desirable in this case that the metal layer be rapidly cooled while the semiconductor substrate is cooled by a coolant, after the intermediate heat-treatment step and before succeeding manufacturing process steps for making the semiconductor device are performed.

An anti-reflective layer made of, for instance, TiN, can be formed on the metal layer after the metal layer is reflowed. The anti-reflective layer enhances the efficiency of succeeding photolithographic process steps. The metal layer can be made of aluminum or an aluminum alloy, and preferably, is made of an aluminum alloy containing less than 0.5% silicon.

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Embodiment 1.

Figure 7:
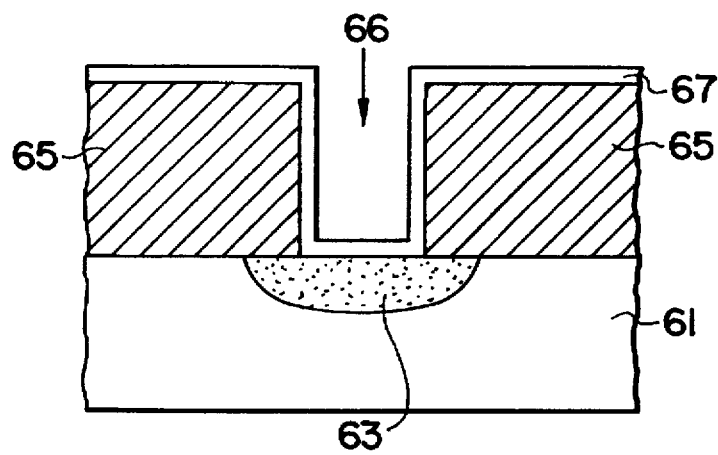
FIGS. 7, 8 and 9 are schematic views illustrating successive steps of a method of forming a wiring layer of a semiconductor device according to an embodiment of the present invention; and, FIG. 10 is an SEM photograph showing the surface of the metal layer obtained by the method depicted in FIGS. 7, 8 and 9.
Figure 8:
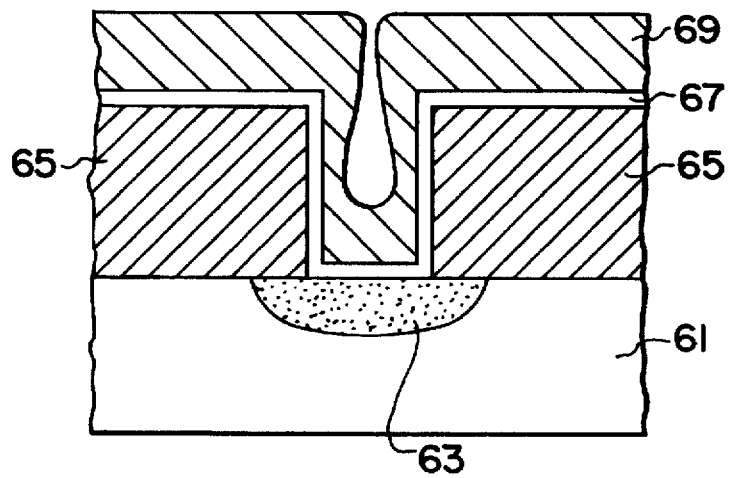

As can be seen in FIG. 7, an insulating layer 65 is formed on a semiconductor substrate 61 having an impurity-doped region 63. The insulating layer 65 preferably has a thickness of about 0.8–1.6 µm, and is preferably made of borophosphosilicate glass (BPSG).

Subsequently, a contact hole 66 is formed in the insulating layer 65, to thereby expose part of the surface of impurity-doped region 63 of semiconductor substrate 61. The size (diameter or width) of the contact hole is preferably 0.5–1.0 µm.

Next, a diffusion blocking layer 67 is formed on the overall surface of insulating layer 65, on the internal surfaces defining the contact hole 66, and on the exposed surface of semiconductor substrate 61. Preferably, under an argon atmosphere of 7 mTorr, titanium is deposited to a thickness of about 200–500 Å (preferably 300 Å), by means of a sputtering method, thereby forming a first diffusion blocking layer (not separately shown). Subsequently, under an argon atmosphere of 7 mTorr in total pressure, 40% of $N_2$ in partial pressure, titanium nitride is deposited to a thickness of about 500–1,000 Å (preferably 900 Å), by means of a sputtering method, thereby forming a second diffusion blocking layer (not separately shown). The first and second diffusion blocking layers together constitute a composite diffusion blocking layer 67. The temperature of the substrate is preferably 200° C. during both deposition steps (Ti and TiN).

Next, the diffusion blocking layer 67 is annealed under a nitride ($N_2$) atmosphere for 30–60 minutes at a temperature of 450–°500° C. Contemporaneously, a small amount of oxygen is introduced to the $N_2$ atmosphere to thereby form an oxide layer (not shown) such as $TiO_2$, TiO or $Ti_2O_3$ on the surface of the diffusion blocking layer 67. The oxide layer blocks the diffusion path along the grain boundary, thereby increasing the diffusion barrier effect. This blocking effect is sometimes referred to as "stuffing."

After completing the steps depicted in FIG. 7, metal is deposited on the diffusion blocking layer 67 in a vacuum, at a low temperature, thereby forming a metal layer 69, preferably to a thickness of 6,000Å. The metal layer 69 can be comprised of a composite layer of a silicon-containing aluminum alloy (e.g., Al-1% Si or Al-0.5% Cu-1% Si) and a silicon-free aluminum alloy (e.g., pure aluminum, Al-0.5Cu or Al—Ti). Alternatively, the metal layer 69 may be made of a single layer of a metal containing a silicon component of 0.5% or less, and is preferably formed of an aluminum alloy (e.g., Al-0.2% Si-0.5% Cu) containing 0.5% -or-less silicon component.

The metal is preferably deposited at a rate of 100–150 Å per second by the sputtering method, under an argon atmosphere below 4 mTorr, at a low temperature below 200° C. A bias voltage of –20 V to –200 V may be applied to the substrate 61. Since lower temperatures translate into higher surface-free energies, the deposited metal has a good reflow characteristic. Therefore, it is advantageous that the metal deposition temperature be as low as possible (preferably, room temperature).

To increase the step coverage of the metal layer 69 on the sidewalls of the contact hole 66, the metal layer 69 may be formed by sputtering, in a relatively low vacuum, under an argon atmosphere below 2 mTorr, or by a multi-step method in which 3,000 Å of the metal layer is deposited by a collimation sputtering method (using a collimator which can perform the sputtering such that many vertically incident grains are created), and in which the remaining thickness of the metal is then deposited by a conventional sputtering method. This results in excellent filling of the contact hole 66. In this embodiment, the metal is preferably deposited at a deposition rate of 125 Å per second, under an argon atmosphere of 2 mTorr.

After the metal layer 69 is formed as described above, the semiconductor wafer is put inside a chamber (not shown), without breaking vacuum. There, the metal layer 69 is heat-treated for about 40 seconds or more (preferably one and a half minutes) at about 500°–550° C., using a backside heating method, by means of an argon conduction process, so that the grains of aluminum alloy migrate into the contact hole 66. The surface temperature of the metal layer 69 is lower than the temperature of the chamber, and is preferably maintained at about 400°–500° C. The migration of aluminum atoms reduces the free energy and surface area thereof, thereby completely filling the contact hole 66 with the metal of metal layer 69.

The heat-treatment process can be carried out under an inert gas (e.g., $N_2$ or Ar) atmosphere or a reducing gas (e.g., $H_2$) atmosphere. Instead of the argon conduction method, any other suitable thermal processing technique can be used, such as rapid thermal annealing or lamp heating, which can be carried out individually or in combination.

Figure 9:
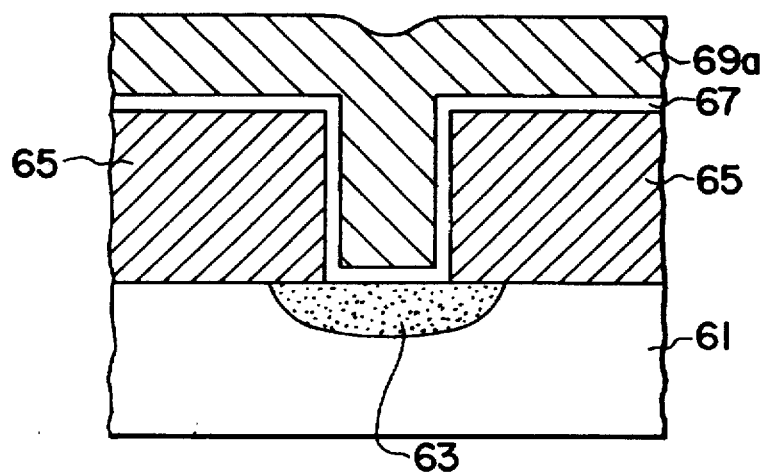

In FIG. 9, reference numeral 69a represents the metal layer 69 subsequent to the above-described treatment process whereby the metal completely fills the contact hole 66.

After the contact hole 66 is completely filled, as described above, an intermediate heat-treatment process is carried out. In this process, the semiconductor substrate 61 is maintained at an intermediate temperature for a predetermined time. If the temperature is below 200° C. the aluminum particles formed on the semiconductor substrate are rapidly cooled and result in grooving, with lower temperatures resulting in even more severe grooving, which is, of course undesirable. On the other hand, if the temperature is too high, the cooling efficiency is decreased. Accordingly, the intermediate heat-treatment process is performed at a temperature between 200° C. and 400° C., and preferably between 250°–350° C. Also, if the period of the intermediate heat treatment is too short, the cooling efficiency is reduced and is thus insufficient for adequately reducing tensile strain, and if too long, the throughput of the overall semiconductor wafer manufacturing process is undesireably reduced. Thus, the intermediate heat treatment step should be maintained for 20–120 seconds, and preferably, for about 30 seconds. In this embodiment, the intermediate heat-treatment process is performed for 30 seconds when the temperature of the chamber is about 300° C. and the temperature of the semiconductor substrate 61 is about 250° C.

Figure 1:
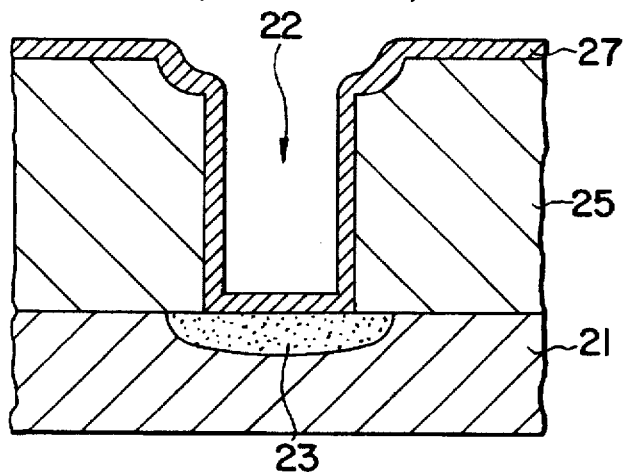
FIGS. 1, 2 and 3 illustrate an example of a method for forming a wiring layer according to a previous invention co-invented by one of the co-inventors of the present invention.
Figure 2:
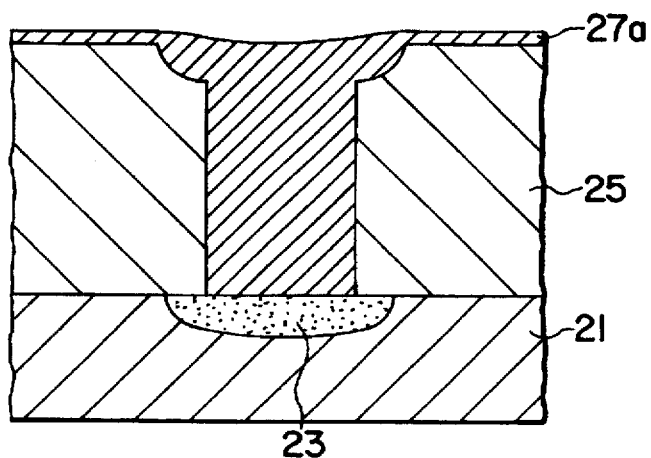
Figure 3:
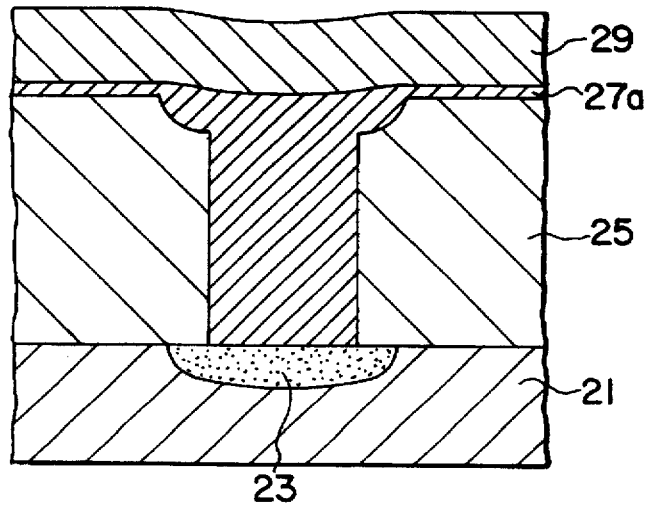
Figure 4A:
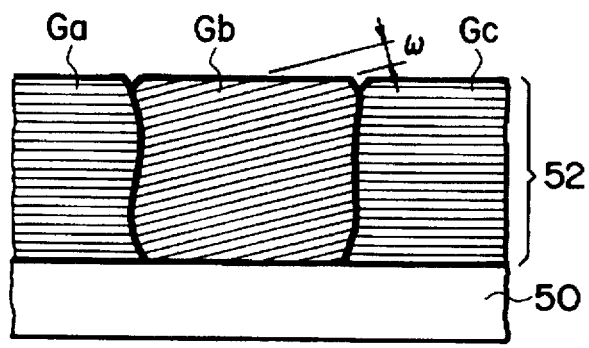
FIGS. 4A and 4B are schematic views of aluminum grains which illustrate a grooving phenomenon.
Figure 4B:
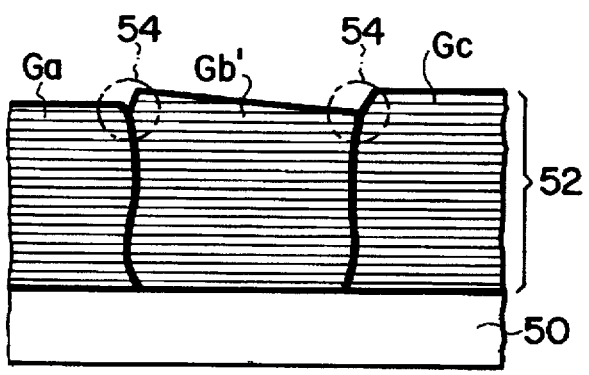
Figure 5:
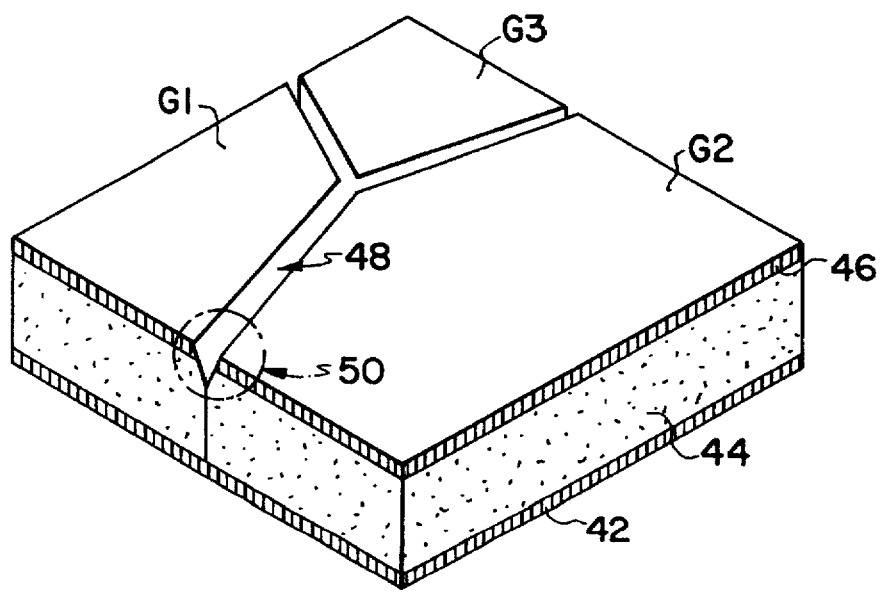
FIG. 5 is a cutaway perspective view of a semiconductor device, which illustrates the grooving phenomenon.

The intermediate heat treatment step alleviates the tensile strain between the grains of the aluminum or aluminum-alloy, and prevents the plastic deformation of the grains of metal layer 69, thereby suppressing the grooving phenomenon shown in FIG. 4B.

After the intermediate heat treatment step, the semiconductor wafer is cooled to below 100° C. in order to facilitate placement of the wafer into a carrier (also called a wafer cassette) made of Teflon (not shown). Cooling is performed rapidly with a coolant such as argon or water, employing a back-side cooling technique. Such rapid cooling suppresses the grooving phenomenon.

In order to enhance succeeding photolithographic process steps, titanium nitride is deposited on the surface of the thermally treated metal layer 69a, preferably to a thickness of 200–500 Å, by means of sputtering, thereby forming an anti-reflective layer (not shown) on the heat treated metal layer 69a. A resist pattern (not shown) is formed on the anti-reflective layer, e.g., by means of a conventional photolithographic process. Using the resist pattern as an etching mask, the anti-reflective layer, metal layer 69a and diffusion blocking layer 67 are sequentially etched, thereby completing the wiring layer (not shown) of the semiconductor device.

Figure 10:

FIG. 10 is an SEM photograph showing the surface of the metal layer obtained by utilizing the method of Embodiment 1. The metal layer thus obtained has a good surface, by virtue of the grooving phenomenon having been suppressed.

Comparative example 1

In this example, the metal layer is formed by using the same method as that of Embodiment 1, except that the intermediate heat-treatment process is performed below 200° C.

Figure 6:
FIG. 6 is an SEM photograph of the surface of a metal layer made of an Al alloy, showing a state in which the grooving phenomenon occurs and the surface of the metal layer becomes uneven.

When the thusly obtained metal layer is observed under a microscope, the grooving phenomenon is evident, as shown in FIG. 6. Thus, as the intermediate heat-treatment temperature decreases, the grooving phenomenon becomes more severe.

Embodiment 2

In Embodiment 1, since the material of the wafer carrier used is Teflon, the semiconductor wafer must be cooled to below 100° C. before being put into the carrier. By contrast, in this embodiment, a semiconductor wafer carrier made of metal is used, thereby enabling the semiconductor substrate to be placed directly into the wafer carrier without having to first be rapidly cooled.

In this embodiment, the metal layer 69a which fills the contact hole 66, is formed in the same way as that of Embodiment 1, except that the intermediate heat-treatment process is performed after the formation of the diffusion blocking layer 67, and then the semiconductor wafer is shifted to a different chamber. After heat treatment, the diffusion blocking layer 67 develops a columnar structure, with water vapor and such impurities as Ar and $N_2$ being removed from the grain boundaries thereof, which improves the adsorption of the aluminum atoms at the initial metal layer deposition stage, and results in the formation of an aluminum layer 69 having excellent <111> orientation. Therefore, the grooving phenomenon does not occur.

After filling the contact hole 66 with the metal layer 69a, the semiconductor wafer is put into the wafer carrier (cassette) made of metal and placed in a vacuum, whereby the semiconductor wafer is cooled. Since the semiconductor wafer carrier is made of metal, the wafer can be directly put into the carrier, where it is preferably cooled for two to five minutes. Since the semiconductor wafer is under vacuum, thermal conduction does not occur, and thus, the semiconductor wafer cools gradually.

Comparative Example 2

The metal layer is formed in the same way as that of Embodiment 2, but without intermediate heat treatment.

Comparative Example 3

The metal layer is formed in the same way as that of Embodiment 2, except that the intermediate heat treatment is performed after the contact hole is filled.

Comparative Example 4

The metal layer is formed in the same way as that of Embodiment 2, except that the intermediate heat treatment is performed both before the metal layer is formed and after the contact hole is filled.

The surface of each of the metal layers obtained by using the method of Embodiment 2 and that of the comparative examples is checked with a microscope in order to determine the presence or absence of the grooving phenomenon. The observed results are shown in the following table.

|  | intermediate heat treatment (before metal layer is formed) | intermediate heat treatment (after contact hole is filled) | surface state |
|---|---|---|---|
| embodiment 2 | yes | no | very good |
| comparative example 2 | no | no | good |
| comparative example 3 | no | yes | poor |
| comparative example 4 | yes | yes | poor |

As indicated in the above table, the metal layer obtained according to Embodiment 2 of the present invention has a good surface because the grooving phenomenon is suppressed. In the case when the intermediate heat treatment is carried out before the metal layer is formed, as in Embodiment 2, it is preferable that the wafer be gradually cooled under vacuum after the contact hole is filled. In this case, the grains of the metal layer are gradually cooled after reflow, thus providing a sufficient period to maintain the initial orientation.

From the above, it can be appreciated that it is preferable that the intermediate heat treatment be carried out selectively either before the metal layer is formed (Embodiment 2) or after the contact hole is filled (Embodiment 1). Further, if the intermediate heat treatment is carried out after the contact hole is filled, and the wafer is gradually cooled (as in comparative example 2 and 4), the surface state is deteriorated. Thus, as in embodiment 1 of the present invention, if the intermediate heat treatment step is performed after the contact hole is filled, the wafer should be rapidly cooled.

Although the present invention has been described hereinabove in connection with specific, preferred embodiments thereof, it should be clearly understood that many variations and/or modifications of the basic inventive concepts herein taught which may appear to those skilled in the art will still fall within the spirit and scope of the present invention as defined in the appended claims.

What is claimed is:

1. A method for forming a metal layer on an underlying layer formed on a semiconductor substrate, comprising the steps of:

forming an underlying layer on a semiconductor substrate and annealing said underlying layer;

subsequent to said step of annealing, maintaining said semiconductor substrate at a first temperature which is between 200° C. and 400° C. for an amount of time;

following said step of maintaining, in a vacuum, depositing a metal at a second temperature on said underlying layer to form a metal layer;

heating said metal layer to a third temperature without breaking said vacuum, thereby causing reflow of grains of said metal layer; and following said step of heating said metal layer to said third temperature, cooling said metal layer;

wherein said second temperature is lower than said third temperature, and said first temperature is intermediate said second and third temperatures.

2. The method as set forth in claim 1, wherein said second temperature is below 200° C.

3. The method as set forth in claim 2, wherein said third temperature is between 500° C. and 550° C.

4. The method as set forth in claim 2, wherein said metal comprises a metal having a melting point Tm and said third temperature is between 0.6 Tm and 1.0 Tm.

5. The method as set forth in claim 4, wherein said first temperature is between 250° C. and 350° C.

6. The method as set forth in claim 1, wherein said step of heating said semiconductor substrate is carried out for 20–120 seconds.

7. The method as set forth in claim 6, wherein said step of heating said metal layer is carried out for at least 40 seconds.

8. The method as set forth in claim 1, wherein, during said step of heating said metal layer to said third temperature, the surface temperature of said metal layer is maintained between 400° C. and 500° C.

9. The method as set forth in claim 1, wherein said step of depositing a metal includes sputtering the metal in an inert gas atmosphere of no greater than 2 mTorr.

10. The method as set forth in claim 1, wherein said step of cooling said metal layer is carried out by placing said semiconductor substrate into a wafer carrier, placing said wafer carrier in a vacuum, and allowing said metal layer to cooled.

11. The method as set forth in claim 10, wherein said step of cooling the metal layer takes place over a period of two to five minutes.

12. The method as set forth in claim 1, wherein said underlying layer comprises a diffusion barrier layer formed on an insulating substrate which is formed on said semiconductor substrate.

13. The method as set forth in claim 1, wherein said underlying layer comprises an insulating layer.

14. The method as set forth in claim 12, wherein said underlying layer has a contact hole formed therein, and wherein further, said depositing step is carried out in such a manner as to fill said contact hole.

15. The method as set forth in claim 1, wherein said underlying layer comprises a diffusion barrier layer formed on an insulating layer formed on said semiconductor substrate.

16. The method as set forth in claim 4, wherein said underlying layer comprises an insulating layer.

17. The method as set forth in claim 15, wherein said underlying layer has a contact hole formed therein, and wherein further, said depositing step is carried out in such a manner as to fill said contact hole.

18. The method as set forth in claim 17, wherein said diffusion barrier layer comprises a composite layer including a first diffusion blocking layer and a second diffusion blocking layer.

19. A method for forming a metal layer on an underlying layer formed on a semiconductor substrate, comprising the steps of:

forming an underlying layer on a semiconductor substrate and annealing said underlying layer;

subsequent to said step of annealing, in a vacuum, depositing a metal at a first temperature on said underlying layer to form a metal layer;

heating said metal layer to a second temperature without breaking said vacuum, thereby causing reflow of grains of said metal layer;

following said step of heating said metal layer to said second temperature, heat-treating said reflowed metal layer by maintaining said semiconductor substrate at a third temperature for an amount of time; and following said step of heat-treating said metal layer, cooling said metal layer by applying a fluid having a fourth temperature to said metal layer, said fourth temperature being below said third temperature;

wherein said first temperature is lower than said second temperature, and said third temperature is intermediate said first and second temperatures.

20. The method as set forth in claim 19, wherein said first temperature is below 200° C.

21. The method as set forth in claim 20, wherein said second temperature is in a range between 500° C. and 550° C.

22. The method as set forth in claim 20, wherein said metal has a melting point Tm and said third temperature is between 0.6 Tm and 1.0 Tm.

23. The method as set forth in claim 22, wherein said third temperature is between 200° C. and 400° C.

24. The method as set forth in claim 22, wherein said third temperature is in a range between 250° C. and 350° C.

25. The method as set forth in claim 23, wherein said step of heat-treating said metal layer to said third temperature is carried out for 20–120 seconds.

26. The method as set forth in claim 25, wherein said step of heating said metal layer to said second temperature is carried out for at least 40 seconds.

27. The method as set forth in claim 23, wherein, during said step of heating said metal layer to said second temperature, the surface temperature of said metal layer is maintained between 400° C. and 500° C.

28. The method as set in claim 23, wherein said step of depositing a metal is carried out by sputtering in an inert gas atmosphere of no greater than 2 mTorr.

29. The method as set forth in claim 19, wherein said step of cooling said metal layer is carried out by using a coolant to rapidly cool said semiconductor substrate to below 100° C.

30. The method as set forth in claim 29, further comprising the step of, after said step of cooling said metal layer, placing said semiconductor substrate into a wafer carrier.

31. The method as set forth in claim 19, wherein said underlying layer comprises a diffusion barrier layer formed on an insulating substrate formed on said semiconductor substrate.

32. The method as set forth in claim 19, wherein said underlying layer comprises an insulating layer.

33. The method as set forth in claim 31, wherein said underlying has a contact hole formed therein and said step of depositing a metal substantially fills said contact hole.

34. The method as set forth in claim 23, wherein said underlying layer comprises a diffusion barrier layer formed on an insulating layer formed on said semiconductor substrate.

35. The method as set forth in claim 23, wherein said underlying layer comprises an insulating layer.

36. The method as set forth in claim 34, wherein said underlying layer has a contact hole formed therein and said step of depositing a metal substantially fills said contact hole.

37. The method as set forth in claim 36, wherein said diffusion barrier layer comprises a composite layer including a first diffusion blocking layer and a second diffusion blocking layer.

38. The method as set forth in claim 1, wherein said underlying layer comprises a first diffusion blocking layer formed by depositing titanium on said semiconductor substrate, and wherein said underlying layer further comprises a second diffusion blocking layer formed on said first diffusion blocking layer, said second diffusion blocking layer being formed by depositing titanium nitride on said first diffusion blocking layer.

39. The method as set forth in claim 19, wherein said underlying layer comprises a first diffusion blocking layer formed by depositing titanium on said semiconductor substrate, and wherein said underlying layer further comprises a second diffusion blocking layer formed on said first diffusion blocking layer, said second diffusion blocking layer being formed by depositing titanium nitride on said first diffusion blocking layer.

40. The method according to claim 1, wherein said step of depositing the metal layer on said underlying layer comprises a step of sputtering, with a bias voltage of between −20 V to −200 V being applied to said semiconductor substrate.

41. The method according to claim 19, wherein said step of depositing the metal layer on said underlying layer comprises a step of sputtering, with a bias voltage of between −20 V to −200 V being applied to said semiconductor substrate.

42. The method according to claim 1, wherein said step of cooling said metal layer comprises cooling with a back-side cooling technique.

43. The method according to claim 1, wherein said underlying layer comprises a diffusion blocking layer, and wherein said step of annealing comprises annealing said diffusion blocking layer under a nitride ($N_2$) atmosphere.

44. The method according to claim 43, wherein said step of annealing comprises annealing said diffusion blocking layer under said nitride ($N_2$) atmosphere for a duration between 30 and 60 minutes.

45. The method according to claim 44, wherein said step of annealing comprises annealing said diffusion blocking layer at a temperature of between 450° C. and 500° C.

46. The method according to claim 1, wherein said step of forming said underlying layer comprises forming said underlying layer within a contact hole exposing a surface of said semiconductor substrate, said contact hole being confined by an insulating layer.

47. The method according to claim 19, wherein said step of forming said underlying layer comprises forming said underlying layer within a contact hole exposing a surface of said semiconductor substrate, said contact hole being confined by an insulating layer.

* * * * *